(12) United States Patent
Wang et al.

(10) Patent No.: US 12,126,350 B2
(45) Date of Patent: Oct. 22, 2024

(54) DIGITAL-TO-ANALOG CONVERTER AND OPERATION METHOD THEREOF

(71) Applicants: Global Unichip Corporation, Hsinchu (TW); Taiwan Semiconductor Manufacturing Company, Ltd., Hsinchu (TW)

(72) Inventors: Ting-Hao Wang, Hsinchu (TW); Hui-Wen Tsai, Hsinchu (TW); Shih-Chun Lo, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 171 days.

(21) Appl. No.: 17/990,737

(22) Filed: Nov. 21, 2022

(65) Prior Publication Data
US 2024/0072816 A1 Feb. 29, 2024

(30) Foreign Application Priority Data
Aug. 24, 2022 (TW) .................................. 111131833

(51) Int. Cl.
*H03M 1/66* (2006.01)
*H03M 1/06* (2006.01)

(52) U.S. Cl.
CPC ................................ *H03M 1/0604* (2013.01)

(58) Field of Classification Search
CPC ...... H03M 1/0673; H03M 1/747; H03M 1/66; H03M 1/067; H03M 3/502; H03M 1/685;
(Continued)

(56) References Cited

U.S. PATENT DOCUMENTS 6,232,903 B1 * 5/2001 Koifman ............. H03M 1/0673
341/144
7,079,063 B1 * 7/2006 Nguyen ................ H03M 1/067
341/145
(Continued)

FOREIGN PATENT DOCUMENTS

| JP | H03143026 | 6/1991 |
|---|---|---|
| JP | 2013201671 | 10/2013 |
| JP | 2018166232 | 10/2018 |

OTHER PUBLICATIONS

"Office Action of Japan Counterpart Application", issued on Mar. 26, 2024, p. 1-p. 4.
(Continued)

*Primary Examiner* — Linh V Nguyen
(74) *Attorney, Agent, or Firm* — JCIPRNET

(57) ABSTRACT

A digital-to-analog converter and an operation method thereof are provided. The digital-to-analog converter includes a current source module, a decoder, a change indicator, and a random number generator. The decoder is coupled to the current source module and receives a digital input signal. The change indicator is coupled to the decoder and provides an indication signal to the decoder. The random number generator is coupled to the change indicator and provides a random number signal to the change indicator. The change indicator generates an indication signal according to the random number signal, and the decoder generates a control signal to the current source module according to the digital input signal and the indication signal, so that the current source module generates an analog output signal corresponding to the digital input signal according to the control signal.

22 Claims, 10 Drawing Sheets

(58) Field of Classification Search
CPC ............. H03M 1/0665; H03M 1/0641; H03M 1/0809; H03M 1/0863; H03M 1/0682; H03M 1/066; H03M 1/76; H03M 3/50; H03M 7/165
USPC .......................................... 341/118–121, 144
See application file for complete search history.

(56) References Cited

U.S. PATENT DOCUMENTS

| | | | |
|---|---|---|---|
| 7,586,429 B1* | 9/2009 | Cerusa ................ | H03M 1/0673 345/97 |
| 8,587,462 B1* | 11/2013 | Cheng .................. | H03M 1/067 341/145 |
| 8,779,959 B1 | 7/2014 | Chuang et al. | |
| 9,384,370 B1* | 7/2016 | Choi .................... | H03M 1/0673 |
| 9,848,152 B1* | 12/2017 | Lin ........................ | H04N 25/75 |
| 10,965,299 B1* | 3/2021 | Kim ....................... | H03M 1/76 |
| 2002/0027518 A1* | 3/2002 | Pinna ................... | H03M 1/0665 341/144 |
| 2002/0084925 A1* | 7/2002 | Dedic ................. | H03M 1/0673 341/153 |
| 2016/0149587 A1* | 5/2016 | Mulder ................. | H03M 7/165 341/96 |
| 2017/0257108 A1* | 9/2017 | Straeussnigg ....... | H03M 1/0854 |
| 2024/0134647 A1* | 4/2024 | Wielage .............. | G06F 9/30145 |

OTHER PUBLICATIONS

"Office Action of Taiwan Counterpart Application", issued on Jul. 6, 2023, p. 1-p. 8.

Hung Yi Huang et al., "A 10-GS/s NRZ/Mixing DAC with Switching-Glitch Compensation Achieving SFDR >64/50 dBc over the First/Second Nyquist Zone," IEEE Journal of Solid-State Circuits, vol. 56, Oct. 2021, pp. 3145-3156.

* cited by examiner

FIG. 8C

|  | D1' |  |  |  |  |  |  | F1' |
|---|---|---|---|---|---|---|---|---|
|  | 1 | 0 | 0 | 0 | 0 | 0 | 0 | 0 |
| F2' 0 | 1 | 0 | 0 | 0 | 0 | 0 | 0 | 0 |
| 1 | 1 | 1 | 0 | 0 | 0 | 0 | 0 | 0 |
| D2' 1 | 1 | 1 | 0 | 0 | 0 | 0 | 0 | 0 |
| 1 | 1 | 1 | 0 | 0 | 0 | 0 | 0 | 0 |
| 0 | 1 | 0 | 0 | 0 | 0 | 0 | 0 | 0 |
| 0 | 1 | 0 | 0 | 0 | 0 | 0 | 0 | 0 |
| 0 | 1 | 0 | 0 | 0 | 0 | 0 | 0 | 0 |
| 0 | 1 | 0 | 0 | 0 | 0 | 0 | 0 | 0 |

|  | F1" | D1" |  |  |  |  |  |  |
|---|---|---|---|---|---|---|---|---|
|  | 0 | 1 | 0 | 0 | 0 | 0 | 0 | 0 |
|  | 0 | 1 | 1 | 0 | 0 | 0 | 0 | 0 |
| 1 | 0 | 1 | 1 | 0 | 0 | 0 | 0 | 0 |
| D2" 1 | 0 | 1 | 1 | 0 | 0 | 0 | 0 | 0 |
| 1 | 0 | 1 | 1 | 0 | 0 | 0 | 0 | 0 |
| 0 | 0 | 1 | 0 | 0 | 0 | 0 | 0 | 0 |
| 0 | 0 | 1 | 0 | 0 | 0 | 0 | 0 | 0 |
| 0 | 0 | 1 | 0 | 0 | 0 | 0 | 0 | 0 |
| F2" 0 | 0 | 1 | 0 | 0 | 0 | 0 | 0 | 0 |

603

DIGITAL-TO-ANALOG CONVERTER AND OPERATION METHOD THEREOF

CROSS-REFERENCE TO RELATED APPLICATION

This application claims the priority benefit of Taiwan application serial no. 111131833, filed on Aug. 24, 2022. The entirety of the above-mentioned patent application is hereby incorporated by reference herein and made a part of this specification.

BACKGROUND

Field of the Disclosure

The present disclosure relates to a converter, and more particularly, to a digital-to-analog converter and an operation method thereof.

Description of Related Art

The common problem of conventional digital-to-analog converter (DAC) is that the current values generated by the multiple internal current sources are inevitably inconsistent, resulting in that the analog signal output by the digital-to-analog converter has the influence of spurious component interference. For example, assuming that the current value provided by at least one of the multiple internal current sources of the digital-to-analog converter is significantly higher or lower, then the digital-to-analog converter might show obvious numerical abnormality in some signals of multiple analog signals sequentially output by the digital-to-analog converter in a continuous (operation) cycle, which will cause the digital-to-analog converter to have poor performance in Integral Non-Linearity (INL) and Spurious Free Dynamic Range (SFDR).

SUMMARY OF THE DISCLOSURE

The present disclosure provides a digital-to-analog converter and an operation method thereof, which may realize a good digital-to-analog conversion function.

The digital-to-analog converter of the disclosure includes a current source module, a decoder, a change indicator, and a random number generator. The decoder is coupled to the current source module and receives a digital input signal. The change indicator is coupled to the decoder and provides an indication signal to the decoder. The random number generator is coupled to the change indicator and provides a random number signal to the change indicator. The change indicator generates an indication signal according to the random number signal, and the decoder generates a control signal to the current source module according to the digital input signal and the indication signal, so that the current source module generates an analog output signal corresponding to the digital input signal according to the control signal.

The operation method of the digital-to-analog converter of the present disclosure includes the following steps: providing a random number signal through a random number generator; generating an indication signal according to the random number signal through a change indicator; receiving a digital input signal and an indication signal through a decoder; generating a control signal to a current source module through the decoder according to the digital input signal and the indication signal; and generating an analog output signal corresponding to the digital input signal through the current source module according to the control signal.

Based on the above, the digital-to-analog converter and its operating method of the present disclosure may generate an indication signal by using a random number signal, and use the decoder to generate a control signal according to the digital input signal and the indication signal, so that the analog output signal generated by the current source module according to the control signal may have less influence of spurious component interference.

In order to make the above-mentioned features and advantages of the present disclosure more comprehensible, the following examples are given and described in detail with the accompanying drawings as follows.

BRIEF DESCRIPTION OF THE DRAWINGS

FIG. 8A to FIG. 8D are diagrams illustrating the exemplary operation of the control signal according to an embodiment of the present disclosure.

DESCRIPTION OF EMBODIMENTS

Figure 1:
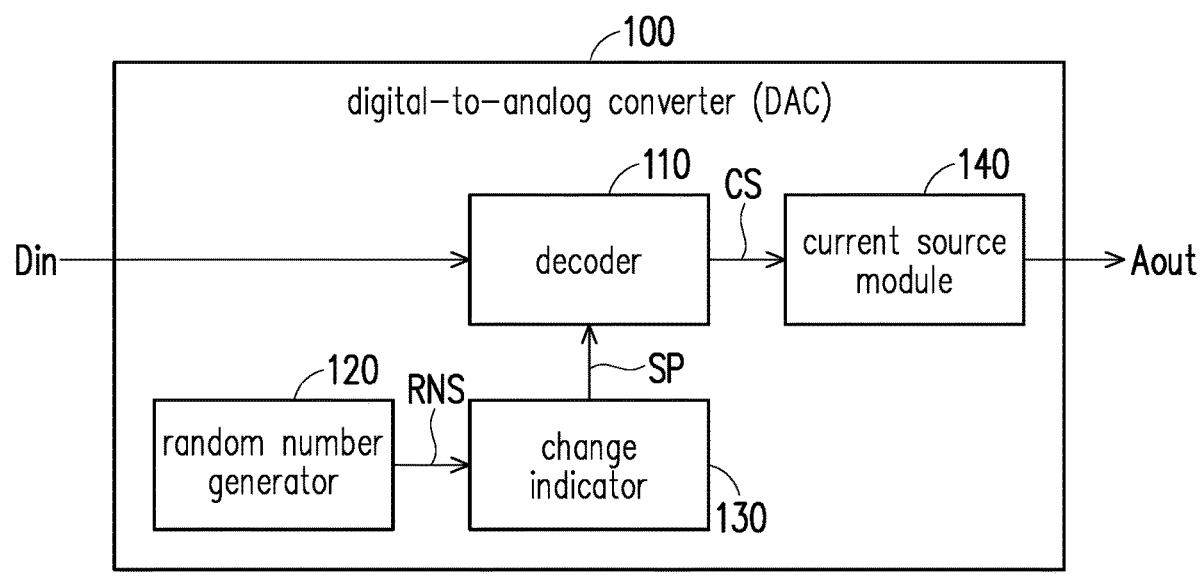
FIG. 1 is a schematic circuit diagram of a digital-to-analog converter according to an embodiment of the present disclosure.

In order to make the content of the present disclosure easily comprehensible, the following specific embodiments are taken as examples by which the present disclosure can indeed be implemented. Additionally, where possible, elements/components/steps using the same reference numerals in the drawings and embodiments represent the same or similar parts.

FIG. 1 is a schematic circuit diagram of a digital-to-analog converter according to an embodiment of the present disclosure. Referring to FIG. 1, a digital-to-analog converter (DAC) 100 includes a decoder 110, a random number generator 120, a change indicator 130 and a current source module 140. In this embodiment, the decoder 110 is coupled to the change indicator 130 and the current source module 140. The random number generator 120 is coupled to the change indicator 130. In this embodiment, the random number generator 120 may provide a random number signal RNS to the change indicator 130, so that the change indicator 130 may generate the indication signal SP according to the random number signal RNS. It should be noted that the change indicator 130 of this embodiment may directly transmit signals or provide multiple sets of simplified indication signals SP through logical operations, and the present disclosure does not limit the signal implementation of the indication signal SP. The decoder 110 may receive the digital input signal Din and the indication signal SP provided by the change indicator 130 to generate the corresponding control signal CS to the current source module 140. The current source module 140 may generate a corresponding analog output signal Aout according to the control signal CS. In this embodiment, the digital input signal Din may include, for example, a code corresponding to at least one of thermal code and binary code, but the disclosure is not limited thereto. The digital-to-analog converter 100 of this embodiment may implement a digital-to-analog converter with a randomly-shifted Dynamic Element Matching (RS-DEM) function.

In this embodiment, the decoder 110 may be a dynamic element matching (DEM) decoder. In this embodiment, the random number generator 120 may be a pseudo random number generator (PRNG) or other types of random number generators, and the generated random number signal may include, for example, a pseudo-random binary sequence (PRBS). In this embodiment, the current source module 140 may further include a plurality of current sources set in sequence, and these current sources may form a current source array, for example, a 1×M current source array, an N×M current source array or a multi-dimensional current source array, and M and N are positive integers. Also, in this embodiment, the digital-to-analog converter 100 may be, for example, a binary-weighted digital-to-analog converter (binary-weighted DAC) (controlled by binary code) or a segmented digital-to-analog converter (segmented DAC) (controlled by binary code and thermal code). In an embodiment, if the digital-to-analog converter 100 is implemented by a circuit structure of a segmented digital-to-analog converter, the current values of the output currents controlled by the thermal code and provided by the current sources may be substantially the same.

In this embodiment, the decoder 110 may determine the amount of current sources to be enabled (turn on) in the current source module 140 according to the digital input signal Din, and may determine the current source object to be enabled according to the indication signal SP. It should be noted that the indication signal SP may instruct different current source objects to provide current output according to the cycle change. Furthermore, since the indication signal SP is generated according to the random number signal RNS, the indication signal SP may have random indication change. For example, in the first cycle, the indication signal SP may instruct the first current source, the second current source, and the third current source to provide current output. Then, in the second cycle, the indication signal SP may instruct the second current source, the third current source and the fourth current source to provide current output. Then, in the third cycle, the indication signal SP may still instruct the second current source, the third current source and the fourth current source to provide current output. In other words, the instructed current source objects to be enabled has a non-fixed change result (the selection is not always started from the next current source in sequence, and the specific operation will be described in detail in the following embodiments). In this way, the current source module 140 of the present embodiment may effectively output the analog output signal Aout corresponding to the digital value of the digital input signal Din, and may have less influence of spurious component interference, thereby having better performance in Integral Non-Linearity (INL) and Spurious Free Dynamic Range (SFDR).

Figure 2:
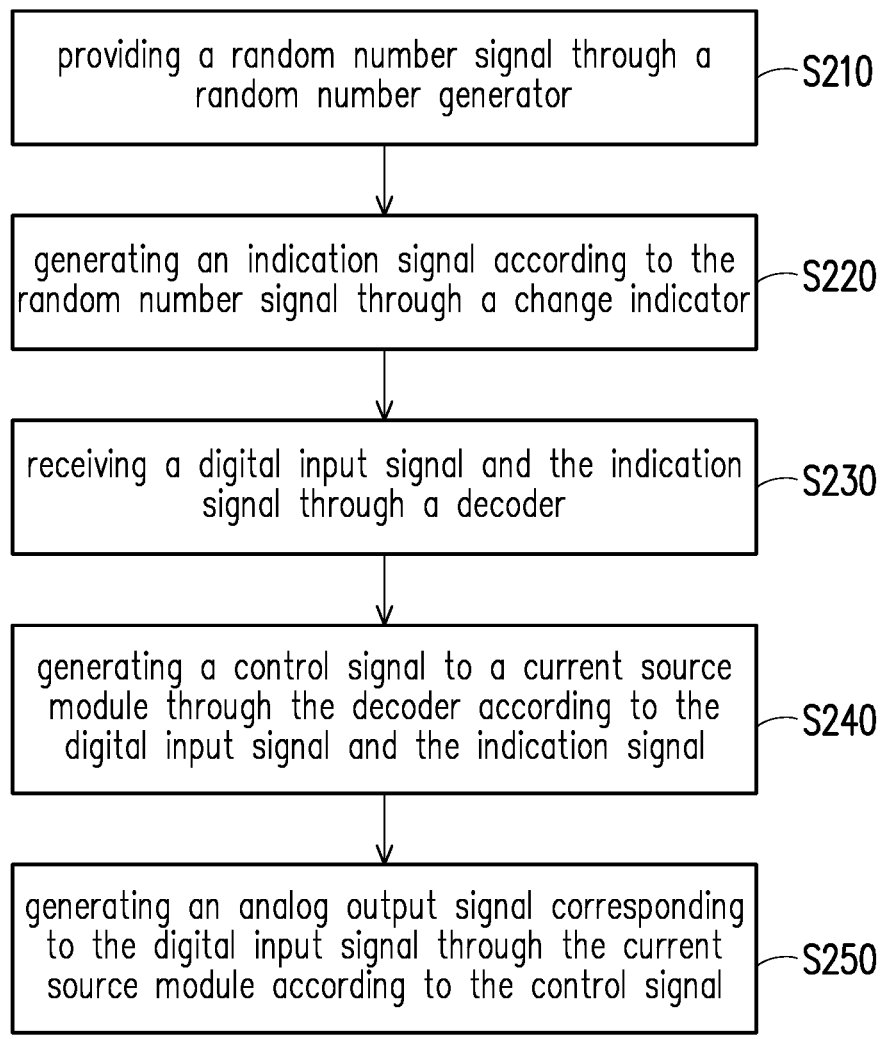
FIG. 2 is a flowchart of an operation method of a digital-to-analog converter according to an embodiment of the present disclosure.

FIG. 2 is a flowchart of an operation method of the digital-to-analog converter according to an embodiment of the present disclosure. Referring to FIG. 1 and FIG. 2, the digital-to-analog converter 100 may, for example, perform the following steps S210-S250. In this embodiment, the digital-to-analog converter 100 may receive the digital input signal Din in one (operation) cycle. In step S210, the digital-to-analog converter 100 may provide a random number signal RNS through the random number generator 120. In this embodiment, the random number signal RNS may be composed of, for example, randomly generated pulse waveforms corresponding to different cycles, for example, when a pulse waveform occurs, it represents a value of "1", and if a pulse waveform does not occur, it represents a value of "0".

In step S220, the digital-to-analog converter 100 may generate an indication signal SP according to the random number signal RNS through the change indicator 130. In this embodiment, the change indicator 130 may determine whether the initial selection value of the indication signal SP is the same as the initial selection value of the previous cycle or different from the initial selection value of the previous cycle according to the random number signal RNS. In this embodiment, the random number signal RNS may be a 1-bit signal. When the change indicator 130 determines according to the random number signal RNS that the initial selection value of the indication signal SP is different from the initial selection value of the previous cycle (the random number signal RNS has a value of "1" in this cycle, for example), the initial selection value of the change indicator 130 is the result of adding 1 to the initial selection value of the previous cycle. When the change indicator 130 determines according to the random number signal RNS that the initial selection value of the indication signal SP is the same as the initial selection keep value of the previous cycle (the random number signal RNS has a value of "0" in this cycle, for example), the initial selection value of the change indicator 130 is the initial selection value of the previous cycle. It should be noted that the change indicator 130 may directly implement the above process, and may also be combined with an inverter, a delay circuit or other related circuits to simultaneously generate a plurality of different groups of indication signals SP with random number changes.

In step S230, the digital-to-analog converter 100 may receive the digital input signal Din and the indication signal SP through the decoder 110. In step S240, the digital-to-analog converter 100 may generate the control signal CS to the current source module 140 through the decoder 110 according to the digital input signal Din and the indication signal SP. If the value corresponding to the code of the digital input signal Din is zero, the amount of current sources to be enabled may also be zero (but not limited at zero, a fixed offset value designed by designer is also allowed). In this embodiment, the decoder 110 may determine the amount of current sources to be enabled according to a value corresponding to the code of the digital input signal Din (e.g., a decimal value, but the present disclosure is not limited to this type of value). On the other hand, the decoder 110 may not only select a plurality of required current sources from a fixed current source as an initial selection object, but also may determine one of a plurality of current sources in the current source module 140 according to the initial selection value of the indication signal SP as the initial selection object. For example, those applying the present embodiment may select one of the multiple current sources in the current source module 140 as the initial selection object through the initial selection value of the indication signal SP, and select other current sources sequentially based on the current source of the initial selection object according to the amount of the current sources to be enabled, so that these selected current sources are enabled to provide current output. Therefore, the decoder 110 may generate the control signal CS according to the amount of current sources to be enabled and the initial selection value. In this embodiment, the control signal CS may include, for example, a plurality of enabling signals (or switch switching signals) for enabling (or turning on) at least one of the plurality of corresponding current sources in the current source module 140.

In step S250, the digital-to-analog converter 100 may generate an analog output signal Aout corresponding to the digital input signal Din through the current source module 140 according to the control signal CS. In this embodiment, the multiple enabled current sources in the current source module 140 may provide current output, and the current source module 140 can output the current of these randomly enabled current sources for combining (adding the current values), so as to generate the analog output signal Aout (i.e., the result of adding the current values corresponding to the current outputs of the enabled current sources). In this way, the operating method and the digital-to-analog converter 100 of this embodiment may generate the analog output signal Aout with better INL and SFDR. In this embodiment, it is also possible that the multiple current sources of the current source module 140 are not enabled. The amount of current source to be enabled is determined according to the value corresponding to the code of the digital input signal Din).

Figure 3:
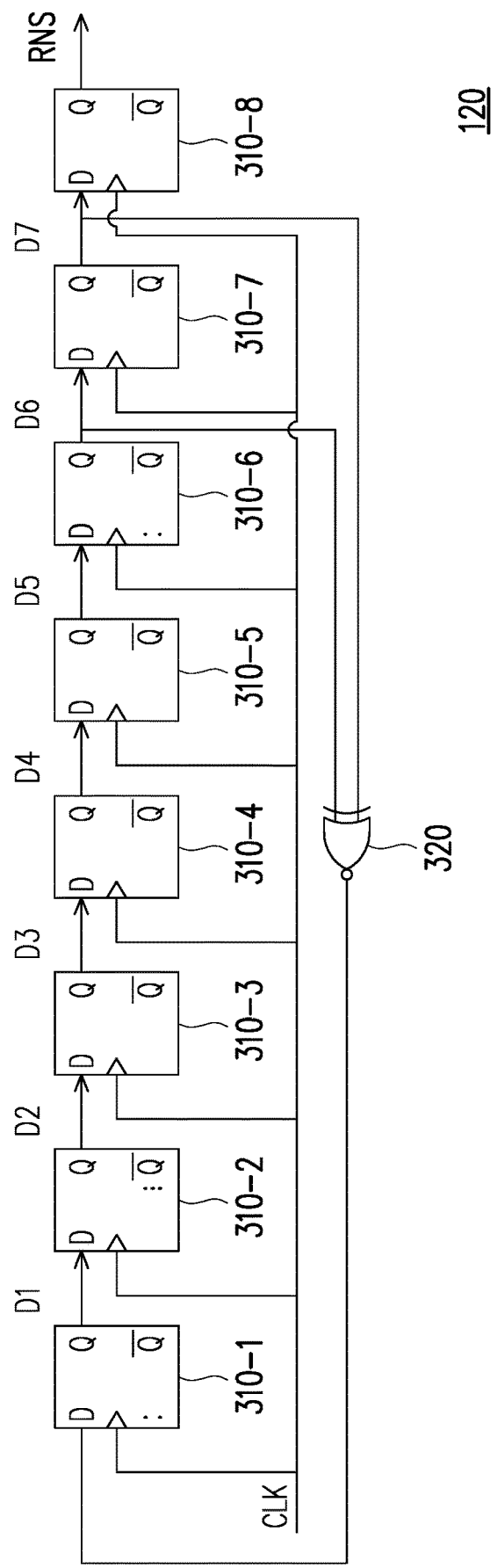
FIG. 3 is a schematic circuit diagram of a random number generator according to an embodiment of the present disclosure.

FIG. 3 is a schematic circuit diagram of a random number generator according to an embodiment of the present disclosure. FIG. 3 provides an example of a random number generator 120 in the embodiment of the present disclosure, which is a 7-bit pseudo-random number generator and has a 1-bit output bit as the random number signal RNS. Specifically, the random number generator 120 in FIG. 3 includes a plurality of shift registers 310-1 to 310-8 and a logic gate 320. The shift registers 310-1 to 310-8 are realized by D-type flip flops. The shift registers 310-1 to 310-7 respectively have output terminals D1 to D7, a timing terminal and an input terminal. The timing terminals of the shift registers 310-1 to 310-8 are coupled to the clock signal CLK. The output terminal of the shift register 310-8 generates a random number signal RNS. The shift registers 310-1 to 310-7 are connected in series. The logic gate 320 may be an XOR gate or an XNOR gate, and the logic gate 320 is configured to feedback the signals of the output terminals of some of the shift registers 310-1 to 310-7 (for example, the output terminals D6 and D7 of the shift registers 310-6 to 310-7 in FIG. 3) to the input terminals of the first stage (i.e., the shift register 310-1) of the shift registers 310-1 to 310-7. The "7-bit" pseudo random number generator means that the random number generator 120 has seven 1-bit shift registers to generate the random number signal RNS. In terms of a 7-bit pseudo random number generator, the signal pattern of the output random number signal RNS will be repeated after 127 cycles. Those who apply this embodiment may adjust the number of shift registers in the random number generator 120 in FIG. 3 to adjust the number of internal bits according to their needs, for example, may be adjusted to a random number generator 120 of 5 bits, 8 bits, 16 bits, etc. It should be noted that the random number signal RNS provided by the last stage (i.e., the shift register 310-8) of the shift registers 310-1 to 310-7 in the random number generator 120 in this embodiment is a 1-bit signal.

Figure 4:
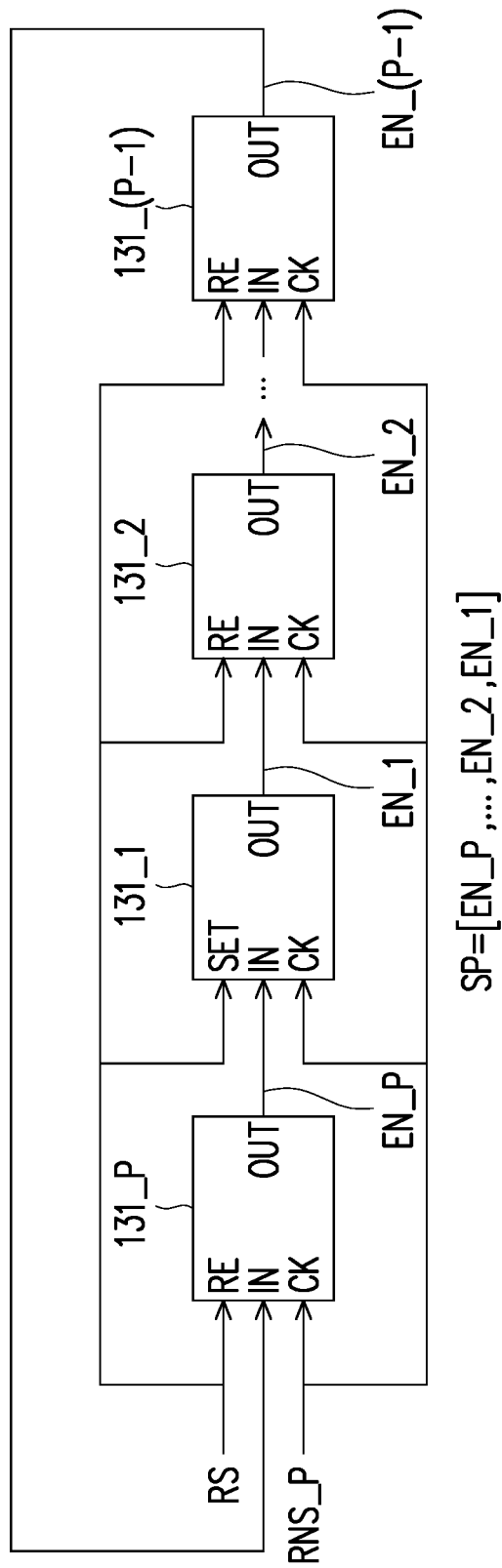
FIG. 4 is a schematic circuit diagram of a change indicator according to an embodiment of the present disclosure.

FIG. 4 is a schematic circuit diagram of the change indicator 130 according to an embodiment of the present disclosure. Referring to FIG. 4, this embodiment is an exemplary embodiment of the change indicator of the present disclosure. In this embodiment, the change indicator 130 may include a plurality of D-type flip-flops 131_P, 131_1 to 131_(P−1) arranged in sequence, and P is a positive integer. In this embodiment, the respective input terminals IN of the D-type flip-flops 131_1 to 131_P are coupled to the corresponding output terminal OUT of the previous-stage D-type flip-flop. The respective clock input terminals CK of the D-type flip-flops 131_1 to 131_P receive a clock signal RNS_P according to the random number signal RNS. The clock signal RNS_P is generated according to the random number signal RNS presented in FIG. 5. The respective reset terminals RE of the D-type flip-flops 131_2 to 131_P receive the reset signal RS, and the setting terminal SET of the D-type flip-flop 131_1 (first stage) receives the reset signal RS. In this embodiment, the output terminal OUT of the D-type flip-flop 131_1 (the first stage) outputs an output signal EN_1 having a corresponding pulse waveform (which may be represented by a value "1"). The indication signal SP of this embodiment is composed of the output signals EN_1 to EN_P on the respective output terminals OUT of the D-type flip-flops 131_2 to 131_P, which will be described in the following.

The output signals EN_1 to EN_P of the D-type flip-flops 131_1 to 131_P may be arranged in sequence to form an indication signal SP, and the initial selection value of indication signal SP is determined by the number of stages corresponding to the output signal with the corresponding pulse waveform (which may be represented by the value "1"). In other words, the indication signal SP of this embodiment is composed of the output signals EN_1 to EN_P, that is, the indication signal SP=[EN_P, EN_(P−1), . . . . EN_1].

In this embodiment, the number of the D-type flip-flops 131_1 to 131_P may correspond to the amount of the current sources. For example, in terms of a 1×M current source array, P equals to M. In another example, in terms of an N×M current source array, the N×M current source array may be divided into two groups for two-dimensional control. One group P is equal to N and is matched with an internal circuit to control the shift behavior of N columns, and the other group P is equal to M and is matched with an internal circuit to control the shift behavior of the M rows. Furthermore, the D-type flip-flops 131_1 to 131_P may also be applied to current source arrays with more dimensions (e.g., 3 dimensions or more).

For example, when the change indicator 130 starts to operate, in the first cycle, the reset signal RS may have a start signal (represented by a value of "1"), the output terminal of the D-type flip-flop 131_1 may output an output signal EN_1 with a corresponding pulse waveform (which may be represented by a value of "1"), and the output signals EN_2 to EN_P of the D-type flip-flops 1312 to 131_P have no pulse waveform (which may be represented by the value "0"). In other words, in the first cycle as the reset phase or the initial phase, the output signal EN_1 is set to a value of "1", and the output signals EN_2 to EN_P are set to a value of "0". Therefore, in the first cycle, the indication signal SP may have a signal waveform corresponding to the value "000000 . . . 001", and the corresponding decimal value is "1" (the value type of the indication signal SP of the present disclosure is not limited thereto).

In the second cycle, if the output terminal of the D-type flip-flop 131_2 receives the output signal EN_1 of the D-type flip-flop 131_1 of the previous stage (which may be represented by a value "1"), and the clock signal RNS_P may have, for example, a pulse waveform (which may be represented by a value of "1" in random number signal RNS), the output terminal of the D-type flip-flop 131_2 may output an output signal EN_2 with a corresponding pulse waveform (which may be represented by a value of "1"), and the output signals EN_1 and EN_3 to EN_P of the D-type flip-flops 131_1 and 131_3 to 131_P have no pulse waveforms (which may be represented by a value of "0"). Therefore, in the second cycle, the indication signal SP may have a signal waveform corresponding to the value "000000 . . . 010" and the corresponding decimal value is "2".

On the contrary, in the second cycle, if the output terminal of the D-type flip-flop 131_2 receives the output signal EN_1 (which may be represented by a value of "1") of the D-type flip-flop 131_1 of the previous stage, and the clock signal RNS_P may not, for example, have a pulse waveform (which may be represented by a value of "0" in random number signal RNS), then the output terminal of the D-type flip-flop 131_1 may maintain to output an output signal EN_1 with a corresponding pulse waveform (which may be represented by a value of "1"), and the output signals EN_2 to EN_P of the D-type flip-flops 131_2 to 131_P have no pulse waveform (which may be represented by a value of "0"). Therefore, in the second cycle, the indication signal SP may maintain the signal waveform corresponding to the value "000000 . . . 001" in the previous cycle, and the corresponding decimal value is "1". By analogy, if the output signal EN_3 has a corresponding pulse waveform (which may be represented by the value "1"), the initial selection value indicated by the current indication signal SP is "3" (decimal).

Figure 5:
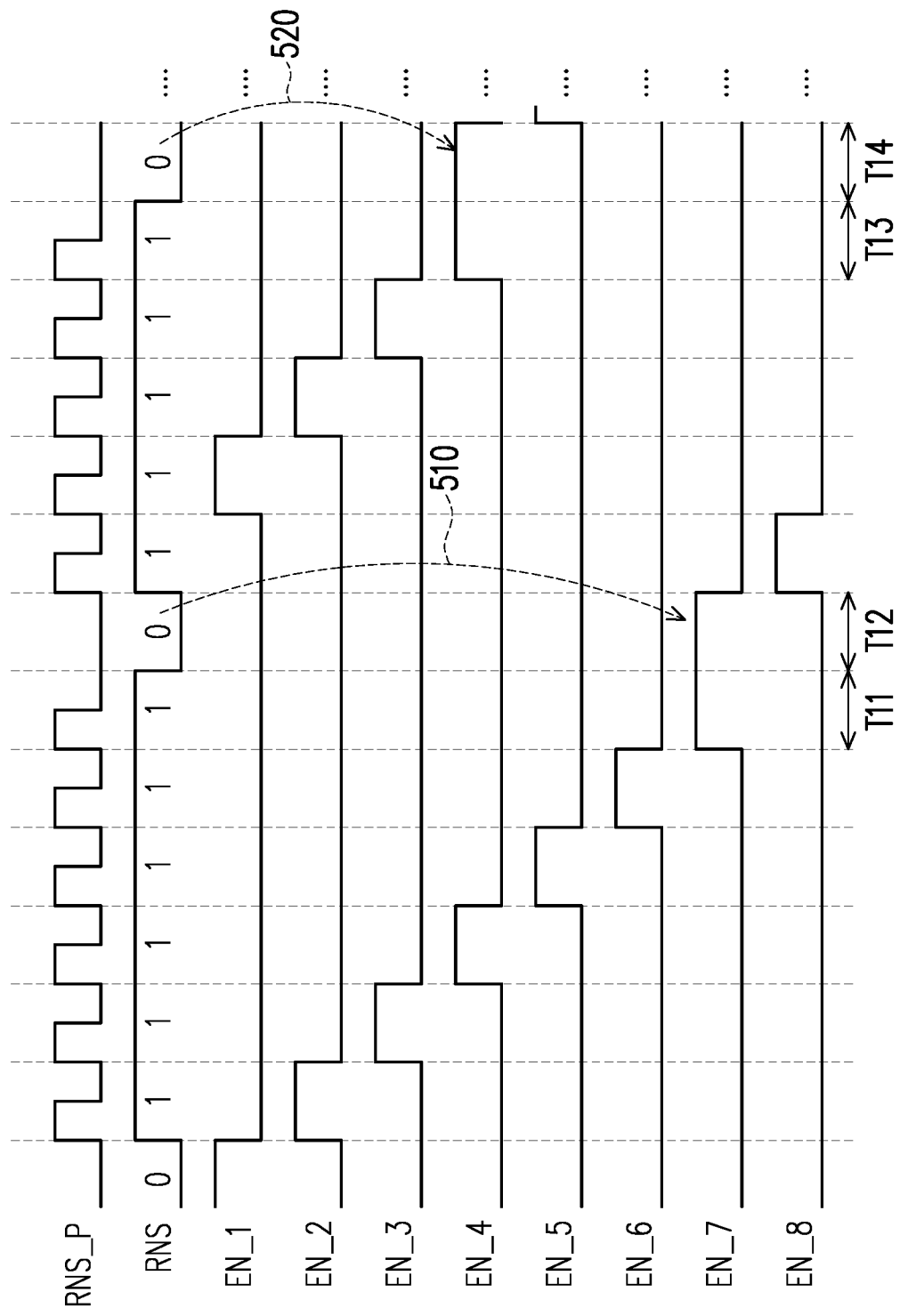
FIG. 5 is a schematic waveform diagram of the random number signal and the output signal generated by the change indicator in FIG. 4.

FIG. 5 is a schematic diagram of waveforms of the clock signal RNS_P, the random number signal RNS and the output signals EN_1 to EN_8 generated by the change indicator 130 in FIG. 4. Assuming that P in FIG. 4 is "8", the change indicator 130 in FIG. 4 includes a plurality of D-type flip-flops 131_1 to 131_8 arranged in sequence, and FIG. 5 presents the clock signal RNS_P, random number signal RNS, and the output signals EN_1 to EN_8 of the D-type flip-flops 131_1 to 1318, so that the present embodiment can be illustrated more clearly. When the value of the random number signal RNS is "0", the clock signal RNS_P has no pulse waveform, and one of the output signals EN_1 to EN_8 of the previous stage that is in the enabled state will continue to be in the enabled state in the next time period. For example, please refer to the time periods T11 and T12 or the time periods T13 and T14 in FIG. 5. In the time period T11, the output signal EN_7 is in the enabled state, the clock signal RNS_P has a pulse waveform, and the value of the random number signal RNS is "1" at this time. Then, because the value of the random number signal RNS in the time period T12 becomes "0", the output signal EN_7 in the enabled state in the time period T11 will continue to be in the enabled state in the time period T12, as indicated by the arrow 510. Similarly, in the time periods T13 and T14, since the value of the random number signal RNS in the time period T13 changes from "1" to "0", the output signal EN_4 that is in the enabled state in the time period T13 will continue to be in the enabled state in the time period T14, as indicated by arrow 520.

Figure 6:
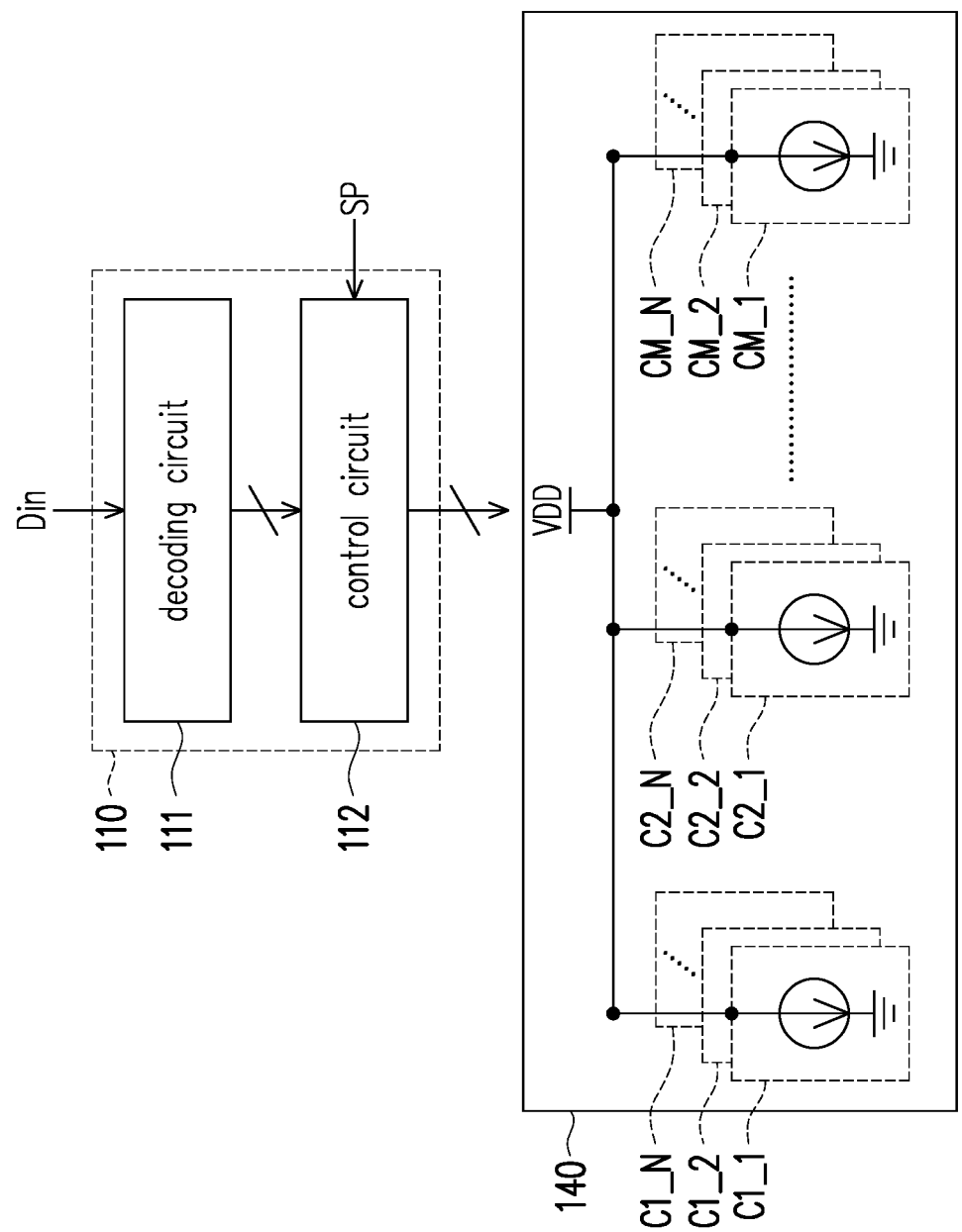
FIG. 6 is a schematic circuit diagram of a decoder and a current source module according to an embodiment of the present disclosure.

FIG. 6 is a schematic circuit diagram of a decoder and a current source module according to an embodiment of the present disclosure. Referring to FIG. 1 and FIG. 6, the decoder 110 and the current source module 140 of FIG. 1 may implement the circuit structure shown in FIG. 6, but the present disclosure is not limited thereto. In this embodiment, the decoder 110 may include a decoding circuit 111 and a control circuit 112. The current source module 140 may include a plurality of current sources C1_1 to CM_N in a two-dimensional structure (i.e., an N×M current source array). The current sources C1_1 to CM_N are coupled to the same voltage VDD. The decoding circuit 111 may be configured to receive the digital input signal Din and decode the digital input signal Din. For example, the digital input signal Din may be, for example, binary code, and after being decoded by the decoding circuit 111, for example, a plurality of decoded signals corresponding to a plurality of numerical values of the thermal code may be generated and provided to the control circuit 112. The control circuit 112 may receive the plurality of decoded signals and the indication signal SP to determine to generate the control signal CS. It should be noted that the control signal CS may include, for example, a plurality of enabling signals, and these enabling signals are used to respectively operate whether the current sources C1_1 to CM_N are turned on to provide current, and the currents of the turned-on current sources are summed up, i.e. an analog output signal Aout is generated.

It should be noted that the current source module 140 of this embodiment is an example of a segmented digital-to-analog converter controlled by thermal code, so the current sources of each group have current values of the same number N. That is, the number and the total current value of the current sources C1_1 to C1_N are the same as the number and the total current value of the current sources C2_1 to C2_N. However, in an embodiment, the current source module 140 may also be implemented by a binary-weighted digital-to-analog converter controlled by a binary code, so each group of current sources may have different current values. Alternatively, in the case where each current source generates the same current value, each group of current sources may be provided differently in number. For example, in the case that each current source generates the same current value, the first group of current sources may include 8 current sources C1_1 to C1_8. The second group of current sources may include four current sources C2_1 to C2_4 (because 8×(½)=4). The third group of current sources may include two current sources C3_1 to C3_2 (because 8×(½)^2=2). The fourth group of current sources may include one current source C4_1 (because 8×(½)^3=1). The difference between various groups of current sources mentioned above results from the fact that those who apply this embodiment perform control through other codes, so as to adaptively adjust the current value generated by various group of current sources. For example, in addition to the thermal code used to perform the control, the control may also be performed through the binary code.

Figure 7A:
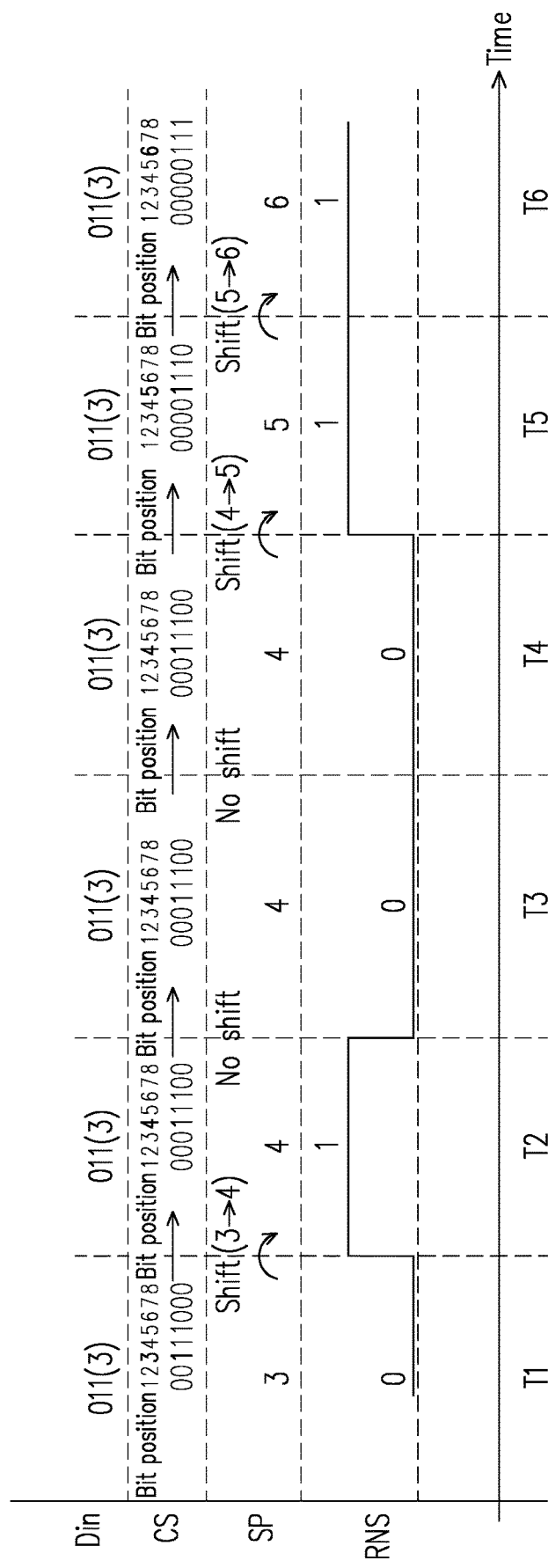
FIG. 7A is a diagram illustrating an exemplary operation of the digital-to-analog converter according to an embodiment of the present disclosure.

FIG. 7A is a diagram illustrating an exemplary operation of the digital-to-analog converter according to an embodiment of the present disclosure. Referring to FIG. 1, FIG. 6 and FIG. 7A, the present embodiment takes a 1×8 current source array where N is "1" and M is "8" as an example. The current source module 140 may include, for example, current sources C1_1 and C2_1 to CM_1 as shown in FIG. 6 (that is, the current sources corresponding to N being "1" and M being "8" in FIG. 6), and each of the current sources C1_1 and C2_1 to C8_1 may be used, for example, to provide a current output of the current value I. In other words, CM_1 in FIG. 6 is C8_1 when M is 8. First of all, it should be noted that the current value I in this embodiment is only used to describe the addition result of current, not the output result of the actual current source, and the actual current values provided by various current sources may be slightly different from each other.

As shown in FIG. 7A, during the time period T1, it is assumed that the random number generator 120 provides a random number signal RNS with a value of "0" to the change indicator 130, and the change indicator 130 may generate an indication signal SP corresponding to a value (initial selection value) of "3" (decimal). When the decoder 110 receives the digital input signal Din with a code of "011" (taking code of binary code as an example), the decoding circuit 111 of the decoder 110 may decode the digital input signal Din to generate a corresponding decoding signal. Since the decimal value corresponding to the code of the digital input signal Din is "3", the amount of current sources to be enabled is three. Moreover, since the value of the indication signal SP is "3", the control circuit 112 of the decoder 110 may determine to select three current sources (e.g., current sources C3_1, C4_1, C5_1) to enable starting from the third current source (e.g., current source C3_1), and generate the control signal CS encoded as "00111000" during the time period T1 as shown in FIG. 7A. Since the values corresponding to the 3rd to 5th bit positions of the control signal CS are "1", it means that the 3rd to 5th current sources (e.g., current sources C3_1, C4_1, C5_1) will be enabled to provide current output. In this regard, the analog output signal Aout may have, for example, a current value of 3×I during the time period T1.

During the time period T2, it is assumed that the random number generator 120 provides the random number signal RNS with a value of "1" to the change indicator 130, and the change indicator 130 may generate an indication signal SP corresponding to the value (initial selection value) of "4" (decimal) (the initial selection value is the result of adding 1 to the initial selection value of the previous cycle). When the decoder 110 still receives the digital input signal Din with a code of "011", the decoding circuit 111 of the decoder 110 may decode the digital input signal Din to generate a corresponding decoded signal. However, the decimal value corresponding to the code of the digital input signal Din is still "3", so the amount of current sources to be enabled is three. Moreover, since the value of the indication signal SP is "4" (shift "3" to "4"), the control circuit 112 of the decoder 110 may determine to select three current sources (e.g., the current sources C4_1, C5_1, C6_1) to enable starting from the fourth current source (e.g., the current source C4_1), and generate the control signal CS encoded as "00011100" during the time period T2 as shown in FIG. 7A. In this regard, the values corresponding to the 4th to 6th bit positions of the control signal CS are "1", which means that the 4th to 6th current sources (such as current sources C4_1, C5_1, C6_1) will be enabled to provide current output. In this regard, the analog output signal Aout may have, for example, a current value of 3×I during the time period T2.

During the time period T3, it is assumed that the random number generator 120 provides the random number signal RNS with a value of "0" to the change indicator 130, and the change indicator 130 may generate an indication signal SP corresponding to a value (initial selection value) of "4" (decimal) (the initial selection value is the same as the initial selection keep value of the previous cycle). When the decoder 110 still receives the digital input signal Din with a code of "011", the decoding circuit 111 of the decoder 110 may decode the digital input signal Din to generate a corresponding decoded signal. However, the decimal value corresponding to the code of the digital input signal Din is still "3", so the amount of current sources to be enabled is three. Since the value of the indication signal SP is "4" (not shifted), the control circuit 112 of the decoder 110 maintains to select three current sources (e.g., current sources C4_1, C5_1, C6_1) to enable starting from the fourth current source (e.g., current source C4_1), and generate the control signal CS encoded as "00011100" during the time period T3 as shown in FIG. 7A. In this regard, the values corresponding to the 4th to 6th bit positions of the control signal CS are "1", which means that the 4th to 6th current sources (such as current sources C4_1, C5_1, C6_1) will be enabled to provide current output. In this regard, the analog output signal Aout may, for example, have a current value of 3×I during the time period T3.

By analogy, during the time period T4, the value of the indication signal SP is "4" (not shifted). The control circuit 112 of the decoder 110 may determine to select three current sources (e.g., current sources C4_1, C5_1, C6_1) to enable starting from the fourth current source (e.g., current source C4_1), and generate a control signal CS encoded as "00011100" during the time period T4 as shown in FIG. 7A. The values corresponding to the 4th to 6th bit positions of the control signal CS are "1", which means that the 4th to 6th current sources (e.g., current sources C4_1, C5_1, C6_1) will be enabled to provide current output. In this regard, the analog output signal Aout may, for example, have a current value of 3×I during the time period T4.

By analogy, during the time period T5, the value of the indication signal SP is "5" (shift "4" to "5"). The control circuit 112 of the decoder 110 may determine to select three current sources (e.g., current sources C5_1, C6_1, C7_1) to enable starting from the fifth current source (e.g., current source C5_1), and generate a control signal CS encoded as "00001110" during the time period T5 as shown in FIG. 7A. In this regard, the values corresponding to the 5th to 7th bit positions of the control signal CS are "1", which means that the 5th to 7th current sources (e.g., current sources C5_1, C6_1, C7_1) will be enabled to provide current output. In this regard, the analog output signal Aout may, for example, have a current value of 3×I during the time period T5.

By analogy, during the time period T6, the value of the indication signal SP is "6" (shift "5" to "6"). The control circuit 112 of the decoder 110 may determine to select three current sources (e.g., current sources C6_1, C7_1, C8_1) to enable starting from the sixth current source (e.g., current source C6_1), and generate a control signal CS encoded as "00000111" during the time period T6 as shown in FIG. 7A. In this regard, the values corresponding to the 6th to 8th bit positions of the control signal CS are "1", which means that the 6th to 8th current sources (e.g., current sources C6_1, C7_1, C8_1) will be enabled to provide current output. In this regard, the analog output signal Aout may, for example, have a current value of 3×I during the time period T6.

Figure 7B:
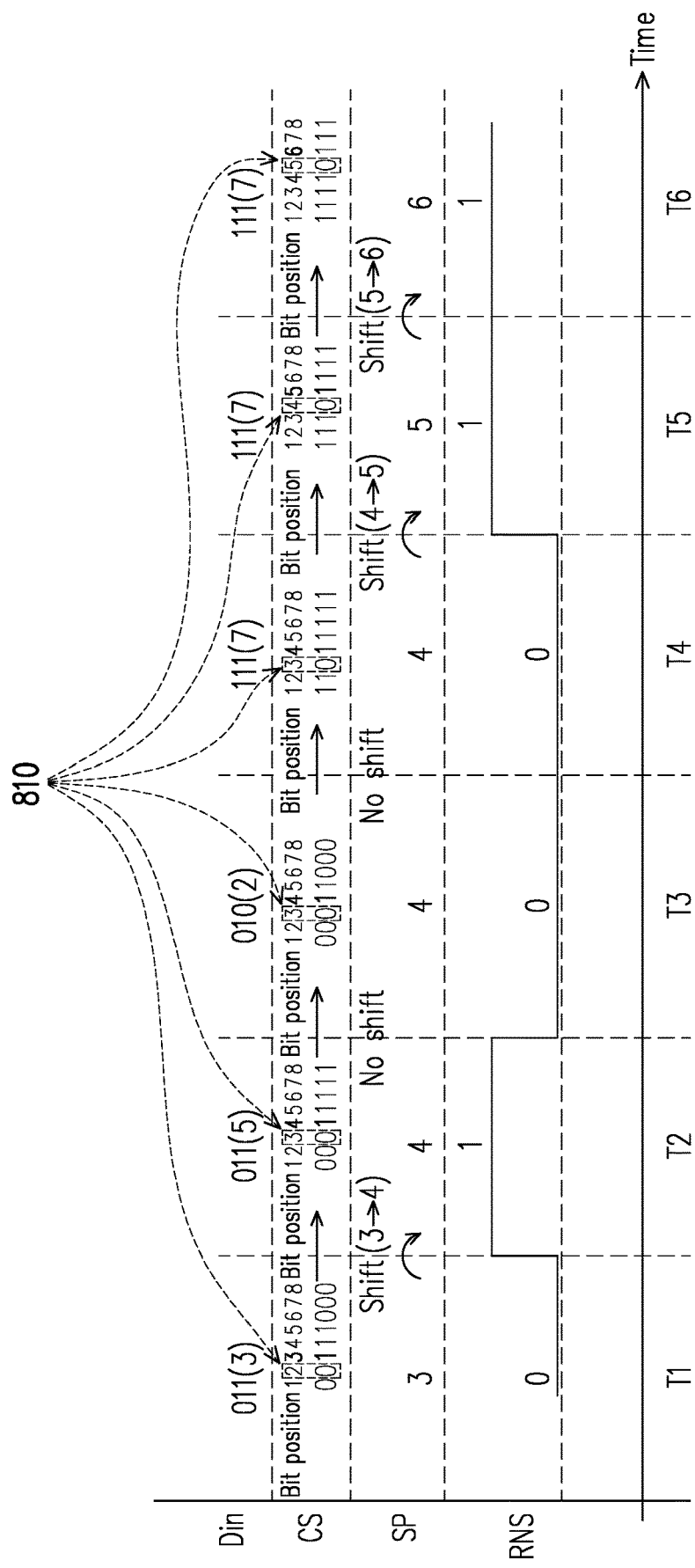
FIG. 7B is a diagram illustrating an exemplary operation of the digital-to-analog converter according to another embodiment of the present disclosure.

FIG. 7B is a diagram illustrating an exemplary operation of the digital-to-analog converter according to another embodiment of the present disclosure. Referring to FIG. 1, FIG. 6 and FIG. 7B, the present embodiment takes a 1×8 current source array as an example. The current source module 140 may include, for example, current sources C1_1 and C2_1 to C8_1 as shown in FIG. 6, and each of the current sources C1_1 and C2_1 to C8_1 may be used to provide a current output of the current value I, for example.

As shown in FIG. 7B, during the time period T1, it is assumed that the random number generator 120 provides a random number signal RNS with a value of "0" to the change indicator 130, and the change indicator 130 may generate an indication signal SP corresponding to the value (initial selection value) as "3" (decimal). When the decoder 110 receives the digital input signal Din with a code of "011" (taking code of binary code as an example), the decoding circuit 111 of the decoder 110 may decode the digital input signal Din to generate a corresponding decoding signal. Since the decimal value corresponding to the code of the digital input signal Din is "3", the amount of current sources to be enabled is three. Moreover, since the value of the indication signal SP is "3", the control circuit 112 of the decoder 110 may determine to select three current sources (e.g., current sources C3_1, C4_1, C5_1) to enable starting from the third current source (e.g., current source C3_1), and generate the control signal CS encoded as "00111000" during the time period T1 as shown in FIG. 7B. In this regard, the values corresponding to the 3rd to 5th bit positions of the control signal CS are "1", which means that the 3rd to 5th current sources (such as current sources C3_1, C4_1, C5_1) will be enabled to provide current output. In this regard, the analog output signal Aout may have, for example, a current value of 3×I during the time period T1.

During the time period T2, it is assumed that the random number generator 120 provides a random number signal RNS with a value of "1" to the change indicator 130, and the change indicator 130 may generate an indication signal SP corresponding to the value (initial selection value) as "4" (decimal) (the initial selection value is the result of adding 1 to the initial selection value of the previous cycle). When the decoder 110 receives the digital input signal Din with a code of "101", the decoding circuit 111 of the decoder 110 may decode the digital input signal Din to generate a corresponding decoding signal. However, since the decimal value corresponding to the code of the digital input signal Din is "5", the amount of current sources to be enabled is five. Moreover, since the value of the indication signal SP is "4" (shift "3" to "4"), the control circuit 112 of the decoder 110 may determine to select five current sources (e.g., current sources C4_1, C5_1, C6_1, C7_1, C8_1) to enable starting from the fourth current source (e.g., current source C4_1), and generate the control signal CS encoded as "00011111" during the time period T2 as shown in FIG. 7B. In this regard, the values corresponding to the 4th to 8th bit positions of the control signal CS are "1", which means that the 4th to 8th current sources (such as current sources C4_1, C5_1, C6_1, C7_1, C8_1) will be enabled to provide current output. In this regard, the analog output signal Aout may have, for example, a current value of 5×I during the time period T2.

During the time period T3, it is assumed that the random number generator 120 provides a random number signal RNS with a value of "0" to the change indicator 130, and the change indicator 130 may generate an indication signal SP corresponding to the value (initial selection value) as "4" (decimal) (the initial selection value is the same as the initial selection keep value of the previous cycle). When the decoder 110 receives the digital input signal Din with a code of "010", the decoding circuit 111 of the decoder 110 may decode the digital input signal Din to generate a corresponding decoding signal. However, since the decimal value corresponding to the code of the digital input signal Din is "2", the amount of current sources to be enabled is two. Moreover, since the value of the indication signal SP is "4" (not shifted), the control circuit 112 of the decoder 110 may determine to select two current sources (e.g., current sources C4_1, C5_1) to enable starting from the fourth current source (e.g., current source C4_1), and generate the control signal CS encoded as "00011000" during the time period T3 as shown in FIG. 7B. In this regard, the values corresponding to the 4th to 5th bit positions of the control signal CS are "1", which means that the 4th to 5th current sources (such as current sources C4_1, C5_1) will be enabled to provide current output. In this regard, the analog output signal Aout may have, for example, a current value of 2×I during the time period T3.

By analogy, during the time period T4, the value of the indication signal SP is "4" (not shifted). The control circuit 112 of the decoder 110 may determine to select seven current sources (e.g., current sources C4_1, C5_1, C6_1, C7_1, C8_1, C1_1, C2_1) to enable starting from the fourth current source (e.g., current source C4_1), and generate a control signal CS encoded as "11011111" during the time period T4 as shown in FIG. 7B. In this regard, the values corresponding to the 1st to 2nd and 4th to 8th bit positions of the control signal CS are "1", which means that the 1st to 2nd and 4th to 8th current sources (e.g., current sources C1_1, C2_1, C4_1, C5_1, C6_1, C7_1, C8_1) will be enabled to provide current output. In this regard, the analog output signal Aout may, for example, have a current value of 7×I during the time period T3.

By analogy, during the time period T5, the value of the indication signal SP is "5" (shift "4" to "5"). The control circuit 112 of the decoder 110 may determine to select seven current sources (e.g., current sources C5_1, C6_1, C7_1, C8_1, C1_1, C2_1, C3_1) to enable starting from the fifth current source (e.g., current source C5_1), and generate a control signal CS encoded as "11101111" during the time period T5 as shown in FIG. 7B. In this regard, the values corresponding to the 1st to 3rd and 5th to 8th bit positions of the control signal CS are "1", which means that the 1st to 3rd and 5th to 8th current sources (e.g., current sources C1_1, C2_1, C3_1, C5_1, C6_1, C7_1, C8_1) will be enabled to provide current output. In this regard, the analog output signal Aout may, for example, have a current value of 7×I during the time period T5.

By analogy, during the time period T6, the value of the indication signal SP is "6" (shift "5" to "6"). The control circuit 112 of the decoder 110 may determine to select seven current sources (e.g., current sources C6_1, C7_1, C8_1, C1_1, C2_1, C3_1, C4_1) to enable starting from the sixth current source (e.g., current source C6_1), and generate a control signal CS encoded as "11110111" during the time period T6 as shown in FIG. 7B. In this regard, the values corresponding to the 1st to 4th and 6th to 8th bit positions of the control signal CS are "1", which means that the 1st to 4th and 6th to 8th current sources (e.g., current sources C1_1, C2_1, C3_1, C4_1, C6_1, C7_1, C8_1) will be enabled to provide current output. In this regard, the analog output signal Aout may, for example, have a current value of 7×I during the time period T6.

The embodiment of the present disclosure also adopts Pseudo DEM (PDEM) under the aforementioned random shifting method, and adds a dummy bit 810 in the code of the control signal CS. The dummy bit is located one bit before the bit position indicated by the code of the digital input signal Din, and the value of the dummy bit 810 remains "0". In detail, it may be seen from the time periods T5 and T6 of FIG. 7B that even if the binary (decimal) value corresponding to the code of the digital input signal Din is "111(7)", the code of the control signal CS is "11101111" and "1110111" respectively. That is, the code of the control signal CS is not entirely "1", because there is a dummy bit 810 with a value of "0". In this way, the control signal CS of the embodiment of the present disclosure is still different from the control signal CS of the previous stage in the case of random shifting, so that the embodiment of the present disclosure does not have the same input value continuously.

Accordingly, in this embodiment, the PDEM method may still be used to change the position where the current source is turned on by random changes, thereby preventing the PDEM method from being ineffective.

Returning to FIG. 1, the current source module 140 of the present disclosure may be implemented by a single-dimensional to multi-dimensional current source array, and each dimension may include multiple current sources. The random number signal RNS may include multiple values. The indication signal SP may include multiple initial selection values. The change indicator 130 may respectively determine according to these values whether the initial selection values of the indication signal SP remain the same as the initial selection values of the previous cycle or different from the initial selection values of the previous cycle. The decoder 110 may respectively determine one of the multiple dimensions of the current source array as the initial selection object according to the initial selection values. The digital input signal Din may include multiple sets of codes. The decoder 110 may determine the amount of currents to be enabled in multiple dimensions of the current source array according to the values (e.g., decimal values) respectively corresponding to the plurality of codes of the digital input signal Din. For example, FIG. 7A and FIG. 7B are implemented by a single-dimensional 1×8 current source array according to an embodiment of the present disclosure. FIG. 8A to FIG. 8D are diagrams illustrating the exemplary operation of the control signal according to an embodiment of the present disclosure, in which a digital-to-analog converter with only a thermometer code function is implemented by an 8×8 current source array with two dimensions. Thermometer code may also be called unary code. Those applying this embodiment may expand the current source array into more dimensions, for example, a current source array with 3, 4, or even 5 dimensions according to their needs.

In the present embodiment of FIG. 8A to FIG. 8D, reference may be made to FIG. 1 and FIG. 6 at the same time. This embodiment takes a current source array in which the current source module 140 has two dimensions as an example (that is, an N×M (8×8) current source array where N is 8 and M is 8). Furthermore, it should be explained first that the random number signal RNS may include a first value and a second value. The indication signal SP may include a first initial selection value and a second initial selection value. The change indicator 130 may determine according to the first value whether the first initial selection value of the indication signal SP remains the same as the first initial selection value of the previous cycle or different from the first initial selection value of the previous cycle. The change indicator 130 may determine according to the second value whether the second initial selection value of the indication signal SP remains the same as the second initial selection value of the previous cycle or different from the second initial selection value of the previous cycle.

In this embodiment, the decoder 110 may determine the initial selection objects of these current sources in the first dimension according to the first initial selection value, that is, for example, select one of the rows as a column of initial selection objects. Moreover, the decoder 110 may determine the initial selection objects of the current sources in the second dimension according to the second initial selection value, that is, for example, select one of the columns as a row of initial selection objects.

In this embodiment, the digital input signal Din may include a first group of codes and a second group of codes. The decoder 110 may determine the amount of currents of the current sources to be enabled according to the values corresponding to the first group of codes (e.g., decimal values) and the values corresponding to the second group of codes (e.g., decimal values) of the digital input signal Din. In some embodiments, the values corresponding to the first group of codes (e.g., decimal values) may be used to control the amount of currents of the current sources to be enabled in the first dimension, and the values corresponding to the second group of codes (e.g., decimal values) are used to control the amount of currents of the currents sources to be enabled in the second dimension. In an embodiment of the present disclosure, other logic methods may also be used to determine the amount of currents of the current sources to be enabled, such as the embodiments of FIG. 8A to FIG. 8D.

This embodiment is implemented using an 8×8 current source array, and a constantly-enabled current source may also be added to as an offset to adjust the intermediate code close to the current balance point (if a segmented DAC with half binary and half thermal code is used, for example). For example, when 32 current sources are enabled and the other 32 current sources are disabled, this embodiment will additionally have a normal-enabled current source as an offset to avoid the generated current being just an intermediate value, so that the decimal code may be closer to the center point. That is to say, when an 8×8 current source array is used, an additional constantly-enabled current source may also be added (but not limited) in this embodiment, so 65 current sources, instead of 64 current sources, may also be allowed to use to realize an 8×8 current source array.

Figure 8A:
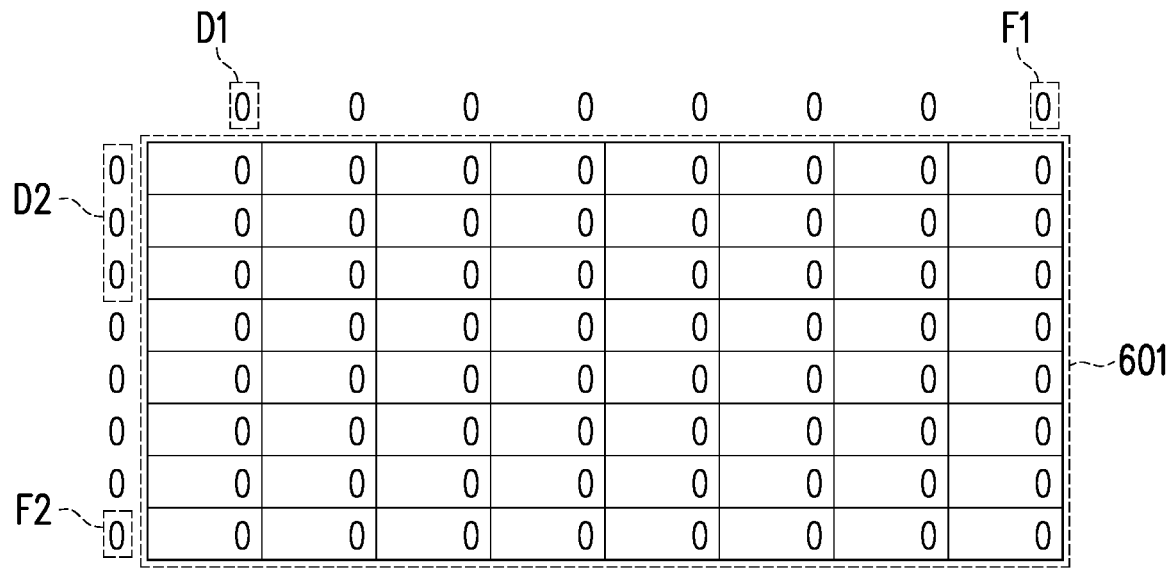

Referring to FIG. 1, FIG. 6 and FIG. 8A, the present embodiment takes an 8×8 current source array as an example. The current source module 140 may include, for example, current sources C1_1 to C8_8 as shown in FIG. 6, and each of the current sources C1_1 to C8_8 may be used to provide a current output of the current value I, for example. The control signal CS may include code information of the code array 601. In the embodiment of the present disclosure, the logic method described below may be used to select the corresponding current source by using the code of the bit position converted from the digital input signal Din. As mentioned above, the digital input signal Din of this embodiment includes a first group of codes and a second group of codes. The first group of codes and the second group of codes may be presented using binary codes. For the convenience of describing FIG. 8A to FIG. 8D of the present embodiment, the first group of codes and the second group of codes herein are respectively converted into decimal code of bit positions on rows (e.g., bit positions D1 to F1) and decimal code of bit positions on columns (e.g., bit positions D2 to F2).

Taking FIG. 8A as the initial situation of this embodiment, the first group of codes and the second group of codes are both binary codes "000". Therefore, both the bit positions on the rows (e.g., the bit positions D1 to F1) and bit positions on the columns (e.g., bit position D2 to F2), the decimal code is always "00000000". In the first group of codes, the bit position D1 on the row is the least significant bit (LSB) "0", and the bit position F1 on the row is the most significant bit (MSB) "0". In the second group of codes, the first bit of the bit position D2 on the column is the least significant bit (LSB), and the bit position F2 on the column is represented as the most significant bit (MSB).

Figure 8B:
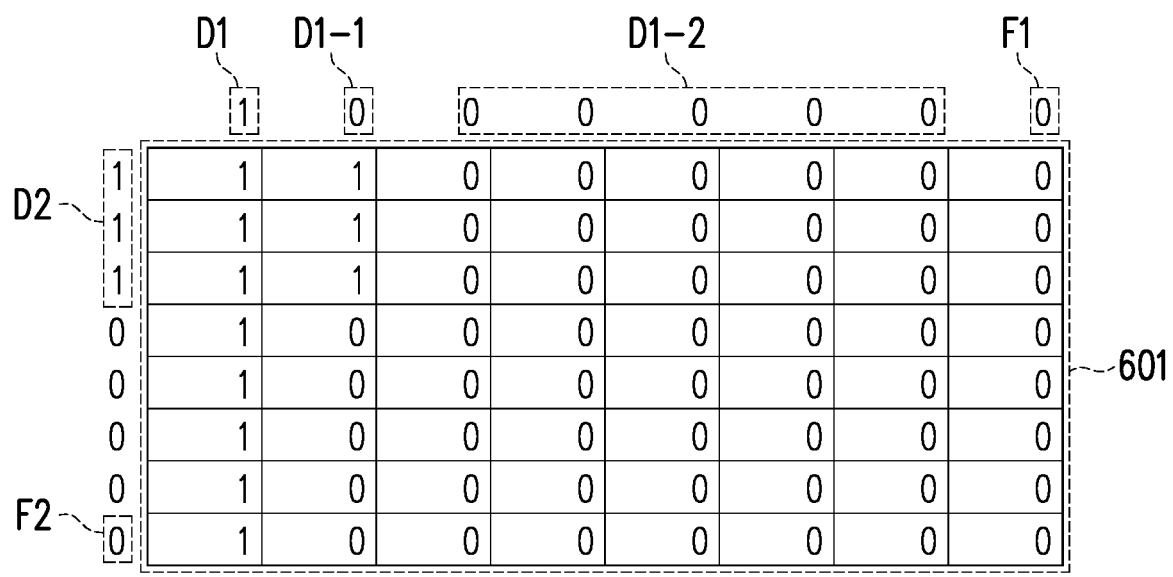

The first group of codes in FIG. 8B (binary code "001") are converted to decimal "1", so the decimal codes for bit positions on the row (e.g., bit positions D1, D1-1, D1-2 to F1) are "10000000", the bit position D1 is the least significant bit (LSB) "1" and the bit position F1 is a the most significant bit (MSB) "0".

On the other hand, the second group of codes (binary code "011") in FIG. 8B are converted to "3" in decimal, so the decimal codes for bit positions (e.g., bit positions D2 to F2) on the column are "11100000". The three bits at the bit position D2 are "111", and the first bit at the bit position D2 is the least significant bit (LSB). The bit position F2 is represented as the most significant bit (MSB) and is "0".

In the code array 601, the code at the bit position on each row and the code at the bit position on each column are used to correspond to the selected current source. Taking FIG. 8A as an example, in this embodiment, the code at the bit positions on the row is confirmed in advance, for example, the bit positions D1, D1-1, D1-2 to F1 are confirmed in sequence. When the code at the bit position (e.g., bit position D1) on the row is "1", it means that all current sources on the column corresponding to the bit position D1 are enabled (turned on). For example, the bit positions D1 to F1 in FIG. 8A are all "0", so the code array 601 in FIG. 8A does not have a whole column being "1". In the code array 601 in FIG. 8B, the 1st column in the code array 601 corresponding to the bit position D1 is all "1".

On the other hand, when the code at the bit position (e.g., bit position D1-1) on the row is the first occurrence of "0", it means that all current sources on the column corresponding to the bit position will be partially enabled (turned on) according to the code at the bit position (e.g., bit positions D2 to F2) on the column, and the other part of the current sources are not enabled (not turned on). Please refer to the column corresponding to the bit position D1 in the code array 601 in FIG. 8A. All the codes of the column and the bit positions (bit positions D2 to F2) of the column are all "0". On the other hand, please refer to the column corresponding to the bit position D1-1 in the code array 601 in FIG. 8B, the first three codes in the column are "1", and the rest of codes in the column are "0". Therefore, the code of the column is exactly the same as the codes at the bit positions D2 to F2. When the code at the bit position (for example, the bit position D1-2) on the row is not the first occurrence of "0", the codes of the multiple columns corresponding to the bit position D1-2 are all "0", which means that the corresponding current source is not enabled (not turned on). Therefore, the code array 601 in FIG. 8A shows that all current sources are not turned on, that is, the current sources in FIG. 6 are disabled; the code array 601 in FIG. 8B shows 8+3=11 current sources that need to be turned on, thereby turning on a total of 11 groups of current sources.

The embodiment of the present disclosure utilizes the logic method to select the corresponding current source by utilizing the code at the bit position converted by the digital input signal Din. By applying this embodiment, it is possible to selectively determine that the code at the bit position (e.g., bit position D1, D1-1, D1-2) on the row is the first, second, or $X^{th}$ occurrence of "0" and the code in the corresponding column is exactly the same as the code at the bit positions D2 to F2, so as to realize the embodiment of the present disclosure, and the implementation is not limited to the foregoing logical method.

Returning to this embodiment, as shown in FIG. 8B, in the first cycle, it is assumed that the random number generator 120 provides a random number signal RNS with a first value of "0" and a second value of "0" to the change indicator 130, and the change indicator 130 may generate an indication signal SP corresponding to the value (first initial selection value) of "1" (decimal) and corresponding to the value (second initial selection value) of "1" (decimal). As mentioned above, when the decoder 110 receives a digital input signal Din with a first group of codes with a value of "001" (for example, binary codes) and a second group of codes with a value of "011" (for example, with binary codes), the decoding circuit 111 of the decoder 110 may decode the digital input signal Din to generate a corresponding decoded signal. Since the total number of current sources to be enabled is 8+3=11, accordingly, the decimal value corresponding to the first group of codes of the digital input signal Din is "1" to indicate that a group of 8 current sources in a column is turned on, and the decimal value corresponding to the second group of codes of the digital input signal Din is "3" to indicate the responsibility for turning on the three groups of current sources. Furthermore, since the values of the indication signal SP are "1" (the first initial selection value) and "1" (the second initial selection value), the decoder 110 may determine to enable all the 8 groups of current sources (such as current sources C1_1~C1_8) of the $1^{st}$ to $8^{th}$ rows in the 1st column, and determine to enable the current sources in the $1^{st}$ to the $3^{rd}$ rows in the 2nd column. That is, three current sources (e.g., current sources C2_1 to C2_3) are selected to enable starting from the first current source in the 2nd column to generate the control signal CS corresponding to the code array 601 during the first cycle as shown in FIG. 8B.

In this regard, in this embodiment, the value corresponding to the bit position D1 on the row in the first group of codes is "1", which represents the 1st to 8th current sources in the 1st column (for example, the current sources C1_1 to C1_8) will be enabled to provide current output. In addition, the value corresponding to the bit position D2 of the column in the second group of codes is "111", which means that the $1^{st}$ to $3^{rd}$ current sources (e.g., current sources C2_1 to C2_3) in the 2nd column will be enabled to provide current output. In this way, the analog output signal Aout may have, for example, a current value of 11×I during the first cycle, and if the 65th group of constantly-enabled current sources added is combined for calculation, the total current value is 11×I+I=12×I.

Next, refer to FIG. 1 and FIG. 8C. As shown in FIG. 8C, in the second cycle, it is assumed that the random number generator 120 provides the random number signal RNS with the first value of "0" and the second value of "1" to the change indicator 130, so the change indicator 130 generates an indication signal SP corresponding to the value (the first initial selection value) of "1" (decimal) and corresponding to the value (the second initial selection value) of "2" (decimal). When the decoder 110 receives the digital input signal Din having the first group of codes with a value of "001" and a second group of codes with a value of "011", the decoding circuit 111 of the decoder 110 may decode the digital input signal Din to generate the corresponding decoded signal. In this embodiment, the decimal value corresponding to the first group of codes of the digital input signal Din is "1" to indicate that a group of 8 current sources in a whole column is turned on, and the decimal value corresponding to the second group of codes of the digital input signal Din is "3" to indicate that the three groups of current sources are turned on. Moreover, since the values of the indication signal SP are "1" (the first initial selection value) and "2" (the second initial selection value), the decoder 110 may determine all the current sources in the 1st column (for example, the current sources C1_1 to C1_8) are all enabled, and three current sources (such as current sources C2_2~C2_4) are selected to enable starting from the current source in the 2nd row and the 2nd column (for example, enable the corresponding current source from the next bit position of the bit position D1' on the row in the first group of codes and the corresponding current source marked by the bit position D2' on the column in the second group of codes through the aforementioned segment mechanism), thereby generating a control signal CS corresponding to the code array 602 during the second cycle as shown in FIG. 8C.

In this regard, in the present embodiment, the value corresponding to the bit position D1' of the row in the first group of codes is "1", and the value "0" corresponding to the bit position F1' on the row in the first group of codes is kept at the same position (because the first value of the random number signal RNS is "0"). Therefore, the 1st to 8th current sources (for example, current sources C1_1 to C1_8) representing the 1st column will be enabled to provide current output. In this embodiment, the value corresponding to the bit position D2' in the 2nd to 4th columns on the column in the second group of codes is "1", and the original preset value "0" in the bit position of the 8th row on the column in the second group of codes (as shown in the bit position F2 in FIG. 8B) is cyclically shifted to the bit position F2' of the 1st row on the column in the second group of codes in FIG. 8C (because the second value of the random number signal RNS is "1"). Therefore, the second to fourth current sources (e.g., current sources C2_2 to C2_4) representing the 2nd column will be enabled to provide current output. In this way, the analog output signal Aout may have, for example, a current value of 11 XI during the second cycle, but is provided by a current source at a different position compared to FIG. 8B, and if the 65th group of constantly-enabled current sources added (but not limited) is combined for calculation, the total current value is 11×I+I=12×I.

Alternatively, refer to FIG. 1 and FIG. 8D. As shown in FIG. 8D, in the second cycle, it is assumed that the random number generator 120 provides the random number signal RNS with the first value of "1" and the second value of "0" to the change indicator 130, and the change indicator 130 may generate an indication signal SP corresponding to the value (the first initial selection value) of "2" (decimal) and corresponding to the value (the second initial selection value) of "1" (decimal). When the decoder 110 receives the digital input signal Din having the first group of codes with a value of "001" and a second group of codes with a value of "011", the decoding circuit 111 of the decoder 110 may decode the digital input signal Din to generate the corresponding decoded signal. In this embodiment, the decimal value corresponding to the first group of codes of the digital input signal Din is "1", which means that there will be a whole column of a group of 8 current sources turned on, and the decimal value corresponding to the second group of codes of the digital input signal Din is "3" to indicate that the three groups of current sources are turned on. Moreover, since the values of the indication signal SP are "2" (the first initial selection value) and "1" (the second initial selection value), the decoder 110 may determine all the current sources in the 2nd column (for example, the current sources C2_1 to C2_8) are all enabled, and the current sources in the 1st to 3rd rows in the 3rd column are controlled and enabled. That is, three current sources (for example, the current sources C3_1 to C3_3) are selected to enable starting from the 1$^{st}$ current source in the 3rd column to generate the control signal CS corresponding to the code array 603 during the second cycle as shown in FIG. 8D.

In this regard, in this embodiment, the value corresponding to the bit position D1" of the 2nd column on the row in the first group of codes is "1", and the original preset value "0" (bit position F1 as shown in FIG. 8A) at the bit position on the 8th column in the row of the first group of codes is cyclically shifted to the bit position F1" of the 1st column of the row in the first group of codes in FIG. 8D (because the first value of the random number signal RNS is "1"). Therefore, the 1st to 8th current sources (e.g., current sources C2_1 to C2_8) representing the 2nd column will be enabled to provide current output. Furthermore, the values corresponding to the bit position D2" of the 1st to 3rd rows on the column in the second group of codes are all "1", and the value "0" corresponding to the bit position F2" on the column in the second group of codes is kept in the same position (because the second value of the random number signal RNS is "0"). Therefore, the 1st to 3rd current sources (such as current sources C3_1 to C3_3) representing the 3rd column will be enabled to provide current output. In this way, the analog output signal Aout may have, for example, a current value of 11I during the second cycle, but is provided by a current source at a different position compared to FIG. 8B and FIG. 8C, and if the 65th group of constantly-enabled current sources added is combined (depends on design and not limited) for calculation, the total current value is 11×I+I=12×I.

To sum up, the digital-to-analog converter and its operation method of the present disclosure may use the random number signal to generate the indication signal through the change indicator, and may generate the corresponding control according to the digital input signal and the indication signal through the decoder, thereby enabling at least one of the plurality of current sources with a random shift selection method over time (operating cycle). Therefore, the analog output signal generated by the digital-to-analog converter of the present disclosure may have better performance in INL and SFDR.

Although the present disclosure has been disclosed above with embodiments, it is not intended to limit the present disclosure. Anyone with ordinary knowledge in the technical field can make some changes and modifications without departing from the spirit and scope of the present disclosure. Therefore, the protection scope of the present disclosure shall be determined by the scope of the appended claims.

What is claimed is:

1. A digital-to-analog converter, comprising:
   a current source module;
   a decoder, coupled to the current source module and receiving a digital input signal;
   a change indicator, coupled to the decoder and providing an indication signal to the decoder; and
   a random number generator, coupled to the change indicator and providing a random number signal to the change indicator,
   wherein the change indicator generates the indication signal according to the random number signal, and the decoder generates a control signal to the current source module according to the digital input signal and the indication signal, so that the current source module generates an analog output signal corresponding to the digital input signal according to the control signal,
   wherein the change indicator further adds a dummy bit to the indication signal, the dummy bit is located one bit before a bit position indicated by a code of the digital input signal, and the dummy bit is set to a value 0.

2. The digital-to-analog converter according to claim 1, wherein the current source module further comprises a plurality of current sources set in sequence,
   wherein the decoder determines an amount of the current sources to be enabled according to a value corresponding to a code of the digital input signal, and the decoder determines one of the current sources as an initial selection object according to an initial selection value of the indication signal, and determines whether to select other current sources starting from the initial selection object in sequence according to the number of the current sources to be enabled, so that at least one of the current sources is enabled to provide a current output.

3. The digital-to-analog converter according to claim 2, wherein the change indicator determines whether the initial selection value of the indication signal remains the same as an initial selection value of a previous cycle or different from the initial selection value of the previous cycle according to the random number signal.

4. The digital-to-analog converter according to claim 3, wherein when the change indicator determines according to the random number signal that the initial selection value of the indication signal is different from the initial selection value of the previous cycle, the initial selection value is a result of adding 1 to the initial selection value of the previous cycle.

5. The digital-to-analog converter according to claim 2, wherein the current sources form a 1×M current source array, and M is a positive integer.

6. The digital-to-analog converter according to claim 2, wherein the current sources form an N×M current source array, and M and N are positive integers.

7. The digital-to-analog converter according to claim 2, wherein the digital input signal comprises a plurality groups of codes,
wherein the decoder determines an amount of currents to be enabled in a plurality of dimensions of a current source array according to values respectively corresponding to the plurality groups of codes of the digital input signal.

8. The digital-to-analog converter according to claim 2, wherein the indication signal comprises a plurality of the initial selection values,
wherein the decoder respectively determines one of a plurality of dimensions of a current source array as an initial selection object according to the initial selection values.

9. The digital-to-analog converter according to claim 8, wherein the random number signal comprises a plurality of values,
wherein the change indicator respectively determines whether the initial selection values of the indication signal remain the same as initial selection values of a previous cycle or different from the initial selection values of the previous cycle according to the values respectively.

10. The digital-to-analog converter according to claim 1, wherein the random number generator comprises:
a plurality of shift registers; and
a logic gate,
wherein the shift registers are connected in series,
the logic gate is configured to feedback output terminals of a part of the shift registers to the shift registers as input terminals of a first stage of the shift registers,
wherein output terminals of a last stage of the shift registers provide the random number signal, and the random number signal is a 1-bit signal.

11. The digital-to-analog converter according to claim 1, wherein the change indicator comprises a plurality of D-type flip-flops arranged in sequence,
wherein an input terminal of each of the D-type flip-flops is coupled to an output terminal of a corresponding D-type flip-flop of a previous stage, and a clock input terminal of each of the D-type flip-flops receives the random number signal, a setting terminal of a first stage of the D-type flip-flops receives a reset signal, and a reset terminal of each of the other stages of the D-type flip-flops receives the reset signal.

12. An operation method of a digital-to-analog converter, comprising:
providing a random number signal through a random number generator;
generating an indication signal according to the random number signal through a change indicator;
receiving a digital input signal and the indication signal through a decoder;
generating a control signal to a current source module through the decoder according to the digital input signal and the indication signal; and
generating an analog output signal corresponding to the digital input signal through the current source module according to the control signal,
wherein the step of generating the control signal to the current source module through the decoder according to the digital input signal and the indication signal comprises:
adding a dummy bit to the indication signal, wherein the dummy bit is located one bit before a bit position indicated by a code of the digital input signal, and the dummy bit is set to a value 0.

13. The operation method according to claim 12, wherein the current source module comprises a plurality of current sources set in sequence, wherein the step of generating the control signal comprises:
determining, through the decoder, an amount of the current sources to be enabled according to a value corresponding to a code of the digital input signal;
determining, through the decoder, one of the current sources as an initial selection object according to an initial selection value of the indication signal; and
determining, through the decoder, whether to select other current sources starting from the initial selection object in sequence according to the number of the current sources to be enabled, so that at least one of the current sources is enabled to provide a current output.

14. The operation method according to claim 13, wherein the change indicator determines whether the initial selection value of the indication signal remains the same as an initial selection value of a previous cycle or different from the initial selection value of the previous cycle according to the random number signal.

15. The operation method according to claim 14, wherein when the change indicator determines according to the random number signal that the initial selection value of the indication signal is different from the initial selection value of the previous cycle, the initial selection value is a result of adding 1 to the initial selection value of the previous cycle.

16. The operation method according to claim 13, wherein the current sources form a 1×M current source array, and M is a positive integer.

17. The operation method according to claim 13, wherein the current sources form an NM current source array, and M and N are positive integers.

18. The operation method according to claim 13, wherein the digital input signal comprises a plurality groups of codes, and the step of generating the control signal further comprises:

determining, through the decoder, an amount of currents to be enabled in a plurality of dimensions of a current source array according to values respectively corresponding to the plurality groups of codes of the digital input signal.

19. The operation method according to claim 13, wherein the indication signal comprises a plurality of the initial selection values, and the step of generating the control signal further comprises:

determining, through the decoder, one of a plurality of dimensions of a current source array respectively as an initial selection object according to the initial selection values.

20. The operation method according to claim 19, wherein the random number signal comprises a plurality of values, wherein the change indicator respectively determines whether the initial selection values of the indication signal remain the same as initial selection values of a previous cycle or different from the initial selection values of the previous cycle according to the values respectively.

21. The operation method according to claim 12, wherein the random number generator comprises:

a plurality of shift registers; and a logic gate, wherein the shift registers are connected in series, the logic gate is configured to feedback output terminals of a part of the shift registers to the shift registers as input terminals of a first stage of the shift registers, wherein output terminals of a last stage of the shift registers provide the random number signal, and the random number signal is a 1-bit signal.

22. The operation method according to claim 12, wherein the change indicator comprises a plurality of D-type flip-flops arranged in sequence, and the step of generating the indication signal comprises:

coupling an input terminal of each of the D-type flip-flops to an output terminal of a corresponding D-type flip-flop of a previous stage;

receiving, through a clock input terminal of each of the D-type flip-flops, the random number signal; and receiving, through a setting terminal of a first stage of the D-type flip-flops, a reset signal, and receiving, through a reset terminal of each of the other stages of the D-type flip-flops, the reset signal.

\* \* \* \* \*